(12) United States Patent
Takaki et al.

(10) Patent No.: US 7,888,145 B2
(45) Date of Patent: Feb. 15, 2011

(54) METHOD OF MANUFACTURING VERTICAL-CAVITY SURFACE-EMITTING LASER DEVICE AND VERTICAL-CAVITY SURFACE-EMITTING LASER DEVICE

(75) Inventors: Keishi Takaki, Tokyo (JP); Norihiro Iwai, Tokyo (JP); Hitoshi Shimizu, Tokyo (JP); Takeo Kageyama, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 82 days.

(21) Appl. No.: 12/029,019

(22) Filed: Feb. 11, 2008

(65) Prior Publication Data
US 2008/0205463 A1 Aug. 28, 2008

(30) Foreign Application Priority Data
Feb. 26, 2007 (JP) ............................ 2007-046254

(51) Int. Cl.
*H01L 21/00* (2006.01)
*H01L 27/15* (2006.01)
(52) U.S. Cl. .................... 438/22; 438/36; 438/770; 257/79; 372/50.124; 372/46.013
(58) Field of Classification Search .................. 257/79; 438/22, 478, 770, 36; 372/50.124, 46.013
See application file for complete search history.

(56) References Cited

U.S. PATENT DOCUMENTS

| | | | | |
|---|---|---|---|---|
| 6,472,695 | B1* | 10/2002 | Hall et al. | 257/190 |
| 2002/0006144 | A1* | 1/2002 | Kobayashi | 372/46 |
| 2002/0097764 | A1* | 7/2002 | Jewell | 372/46 |
| 2006/0227835 | A1* | 10/2006 | Ueki et al. | 372/50.124 |

FOREIGN PATENT DOCUMENTS

JP 2004-319643 11/2004

OTHER PUBLICATIONS

Kent D. Choquette, et al., "Advances in Selective Wet Oxidation of AlGaAs Alloys", IEEE Journal of Selected Topics in Quantum Electronics, vol. 3, No. 3, Jun. 1997, pp. 916-926.
G. W. Pickrell, et al., "Improvement of wet-oxidized $Al_xGa_{1-x}As$ (x ~ 1) through the use of AlAs/GaAs digital alloys", Applied Physics Letters, American Institute of Physics, vol. 76, No. 18, May 1, 2000, pp. 2544-2546.
U.S. Appl. No. 12/108,931, filed Apr. 24, 2008, Iwai, et al.

\* cited by examiner

*Primary Examiner*—Thanh V Pham
*Assistant Examiner*—Maria Ligai
(74) *Attorney, Agent, or Firm*—Oblon, Spivak, McClelland, Maier & Neustadt, L.L.P.

(57) ABSTRACT

A selective oxidation layer is formed by alternately growing an AlAs layer and an XAs layer containing a group III element X with a thickness ratio in a range between 97:3 and 99:1 on a plurality of semiconductor layers including an active layer. The selective oxidation layer is selectively oxidized to manufacture a vertical-cavity surface-emitting laser.

12 Claims, 5 Drawing Sheets

METHOD OF MANUFACTURING VERTICAL-CAVITY SURFACE-EMITTING LASER DEVICE AND VERTICAL-CAVITY SURFACE-EMITTING LASER DEVICE

BACKGROUND OF THE INVENTION

1. Field of the Invention

The present invention relates to a method of manufacturing a vertical-cavity surface-emitting laser (VCSEL) device and the VCSEL device.

2. Description of the Related Art

As a conventional vertical-cavity surface-emitting laser (VCSEL) device, Japanese Patent Application Laid-Open No. 2004-319643 discloses a VCSEL device obtained by growing an active layer between an upper semiconductor multilayer mirror and a lower semiconductor multilayer mirror, to form a distributed Bragg reflector (DBR) laser, and further forming a current confinement layer for confining a current path to increase the current injection efficiency. The current confinement layer is formed by selectively oxidizing an AlAs layer, and includes a circular current confinement region of AlAs located at the center and a selectively-oxidized region of aluminum oxide located around the current confinement region. The current confinement region works as a current path when a current is injected into the VCSEL and an aperture area through which a laser light is emitted.

When the current confinement layer is formed by selectively oxidizing the AlAs layer, there is a case where anisotropy occurs in the oxidation rate, causing a shape of the current confinement region to be a rhombus, and the current density is concentrated to an edge of the rhombus to make an origin of a dislocation. To solve this problem, a technology is disclosed in K. D. Choquette et al., "Advances in selective wet oxidation of AlGaAs alloys", IEEE Journal of Selected Topics in Quantum Electronics, vol. 3, No. 3, pp. 916-926 (1997), in which the anisotropy of the oxidation rate is resolved by using an AlGaAs layer as a selective oxidation layer instead of the AlAs layer.

However, the AlGaAs layer has a small composition ratio of Ga, and thus it is difficult to control the composition ratio to a desired value. A technology to solve the problem is disclosed in G. W. Pickrell et al., "Improvement of wet-oxidized $Al_xGa_{1-x}As$ (x to 1) through the use of AlAs/GaAs digital alloys", Appl. Phys. Lett., vol. 76, No. 18, pp. 2544-2546 (2000), in which the anisotropy of the oxidation rate is suppressed in a well-controlled manner by employing AlAs/GaAs digital alloys as a selective oxidation layer, which is formed by alternately growing an AlAs layer and a GaAs layer.

If the thickness of the AlAs layer is thick, a stress occurring in a selectively-oxidized region when the AlAs layer is selectively oxidized to form the current confinement layer becomes large. Consequently, the reliability of the VCSEL may decrease; and therefore, the thickness of the AlAs layer is required to be as thin as possible. It is reported in K. D. Choquette et al., "Advances in selective wet oxidation of AlGaAs alloys", IEEE Journal of Selected Topics in Quantum Electronics, vol. 3, No. 3, pp. 916-926 (1997) that there is a relationship between the thickness of the AlAs layer and the oxidation rate of the AlAs layer when the current confinement layer is formed by selectively oxidizing the AlAs layer. The oxidation rate mentioned here indicates an oxidation rate in a direction parallel to the main surface of the AlAs layer.

FIG. 11 is a graph of the relationship between the thickness and the oxidation rate of the AlAs layer. If the thickness of the AlAs layer is thin, as shown in FIG. 11, the oxidation rate rapidly changes with the change in the thickness of the layer. Namely, the oxidation rate is highly layer-thickness dependent. Consequently, if a large number of VCSELs are formed on a single substrate, even though a difference in thicknesses of the AlAs layers in a substrate plane is a slight amount, a difference in the oxidation rate between the lasers becomes significant. This causes fluctuation in diameters of current confinement regions of the VCSELs.

SUMMARY OF THE INVENTION

It is an object of the present invention to at least partially solve the problems in the conventional technology.

According to an aspect of the present invention, there is provided a method of manufacturing a VCSEL having a selectively-oxidized current confinement layer. The method includes forming a selective oxidation layer by alternately growing an AlAs layer and an XAs layer containing a group III element X with a thickness ratio in a range between 97:3 and 99:1 on a plurality of semiconductor layers including an active layer; and selectively oxidizing the selective oxidation layer.

Furthermore, according to another aspect of the present invention, there is provided a VCSEL that is manufactured by forming a selective oxidation layer by alternately growing an AlAs layer and an XAs layer containing a group III element X with a thickness ratio in a range between 97:3 and 99:1 on a plurality of semiconductor layers including an active layer and selectively oxidizing the selective oxidation layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings. It is noted that the present invention is not limited by these embodiments.

A VCSEL 100 according to the first embodiment is formed of a GaAs semiconductor material containing Ga of a group III element.

Figure 1:
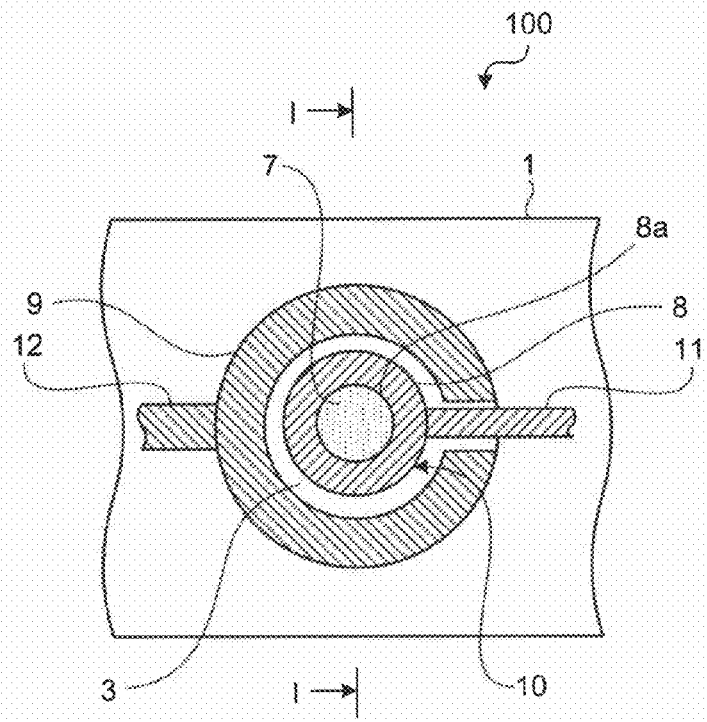
FIG. 1 is a schematic plan view of a VCSEL according to a first embodiment of the present invention.
Figure 2:
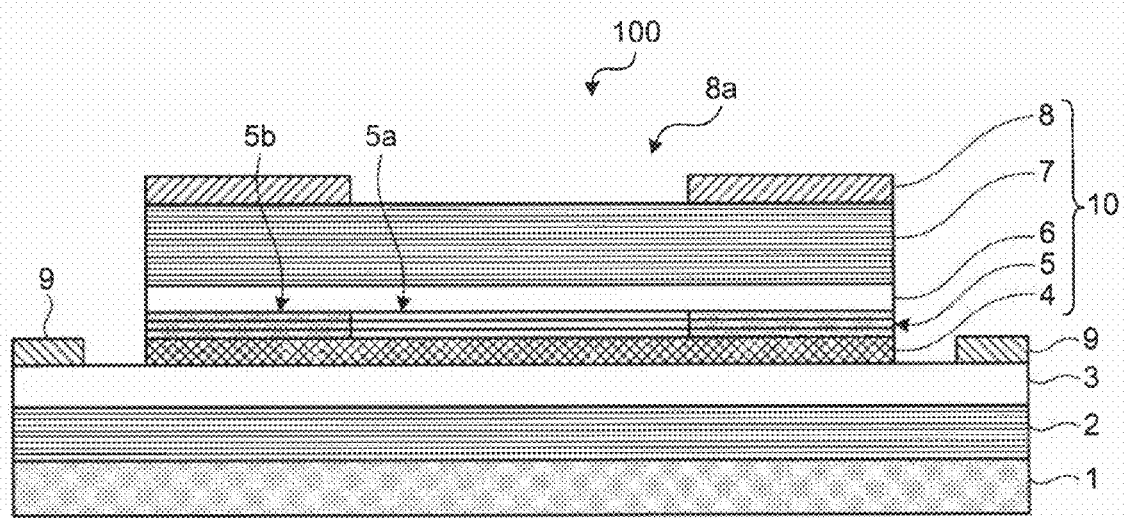
FIG. 2 is a cross section of the VCSEL taken along the line I-I of FIG. 1.

FIG. 1 is a schematic plan view of the VCSEL 100 according to the first embodiment. FIG. 2 is a cross section of the VCSEL taken along the line I-I of FIG. 1. As shown in FIGS. 1 and 2, the VCSEL 100 contains a lower distributed Bragg reflector (DBR) mirror 2, an n-cladding layer 3, an active layer 4, a multilayer current confinement layer 5, a p-cladding layer 6, an upper DBR mirror 7, a p-electrode 8, and an n-electrode 9, which are laminated in this order on a semi-insulating substrate 1. The active layer 4, the multilayer current confinement layer 5, the p-cladding layer 6, the upper DBR mirror 7, and the p-electrode 8 laminated on the n-cladding layer 3 form a cylindrical mesa post 10. It is noted that a large number of those which are the same as the VCSEL 100 are formed on a piece of the substrate 1. Each of the components is explained below.

The lower DBR mirror 2 is formed as a semiconductor multilayer mirror in which a plurality of composite layers each containing, for example, n-type AlGaAs/GaAs is laminated. The thickness of each layer forming the composite layers is $\lambda/4$ n ($\lambda$: emission wavelength, and n: refractive index). On the other hand, the upper DBR mirror 7 is formed as a semiconductor multilayer mirror in which a plurality composite layers each containing, for example, p-type AlGaAs/GaAs are laminated. The thickness of each layer forming the composite layers is $\alpha/4$ n.

The n-cladding layer 3 is formed of, for example, n-type GaAs, while the p-cladding layer 6 is formed of, for example, p-type GaAs. The active layer 4 has a three-layer quantum well structure of, for example, GaInNAs/GaAs.

The p-electrode 8 has a ring shape with an aperture 8a having a predetermined diameter and is formed on the upper DBR mirror 7. On the other hand, the n-electrode 9 has a C-letter shape and is formed so as to surround the mesa post 10 on the n-cladding layer 3. The p-electrode 8 and the n-electrode 9 are electrically connected to an externally provided current supply circuit (not shown) by a p-extraction electrode 11 and an n-extraction electrode 12 respectively.

Figure 3:
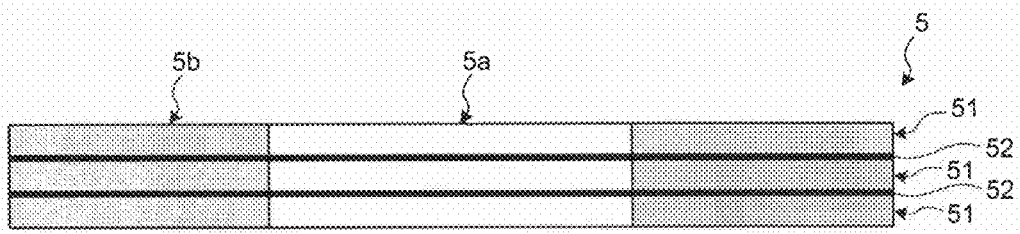
FIG. 3 is a cross section of a detailed configuration of a multilayer current confinement layer of the VCSEL as shown in FIG. 2.

FIG. 3 is a cross section of a detailed configuration of the multilayer current confinement layer 5 of the VCSEL 100 as shown in FIG. 2. The multilayer current confinement layer 5 contains a current confinement layer 51 and an AlGaAs layer 52 which are alternately laminated. More specifically, the current confinement layer 51 contains a current confinement region 5a of AlAs, and has a center and a diameter of the region substantially the same as these of the aperture 8a of the p-electrode 8. The current confinement layer 51 also contains a selectively-oxidized region 5b of aluminum oxide and formed around the outer periphery of the current confinement region 5a. A ratio of the thickness of the current confinement layer 51 to that of the AlGaAs layer 52 is, for example, in a range of 97:3 to 99:1.

The VCSEL 100 applies a voltage between the p-electrode 8 and the n-electrode 9 from the externally provided current supply circuit through the p-extraction electrode 11 and the n-extraction electrode 12 respectively, and injects a current thereto. The current path is then confined in the current confinement region 5a by the multilayer current confinement layer 5, and the current with high current density is supplied to the active layer 4. As a result, carrier is injected to the active layer 4 to emit spontaneous emission, and an optical cavity formed of the lower DBR mirror 2 and the upper DBR mirror 7 causes the spontaneous emission to emit laser emission. The laser light then outputs from the aperture 8a of the p-electrode 8.

The selectively-oxidized region 5b of the multilayer current confinement layer 5 is formed in a manufacturing process when the oxidation rate has low layer-thickness dependency, as explained later. Therefore, fluctuations in diameters of the current confinement regions 5a among the VCSELs 100 formed in the substrate 1 are small. A method of manufacturing the VCSEL 100 according to a second embodiment of the present invention is explained below.

Figure 4:
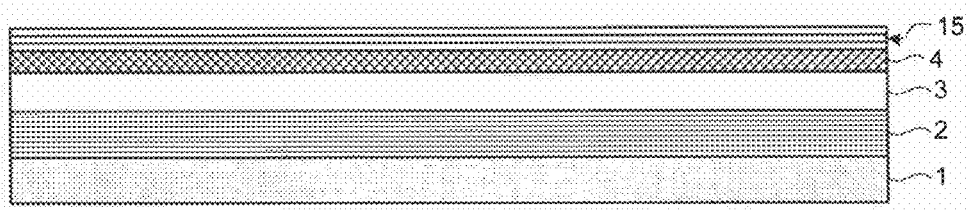
FIG. 4 is a schematic diagram for explaining a method of manufacturing the VCSEL according to a second embodiment of the present invention.
Figure 5:
FIG. 5 is a schematic diagram for explaining the method of manufacturing the VCSEL according to the second embodiment.

FIGS. 4 to 7 are schematic diagrams for explaining the method of manufacturing the VCSEL according to the second embodiment. As shown in FIG. 4, for example, a metalorganic chemical vapor deposition (MOCVD) method is used to laminate the lower DBR mirror 2, the n-cladding layer 3, and the active layer 4 in this order on the substrate 1, and further form a selective oxidation layer 15 to form the multilayer current confinement layer 5. As shown in FIG. 5, the selective oxidation layer 15 is formed by alternately laminating three AlAs layers 151 and two GaAs layers 152 at a thickness ratio in a range of 97:3 to 99:1. For example, the thickness of the AlAs layer 151 is 4.95 nanometers, and the thickness of the GaAs layer 152 is 0.05 nanometer. These thicknesses can be adjusted by an open/close time of a supply port when material gas is supplied. If the layer thickness is equal to or less than 1 monolayer (ML), the layer thickness is defined by an average thickness of lamination layers in a lamination plane.

Figure 6:
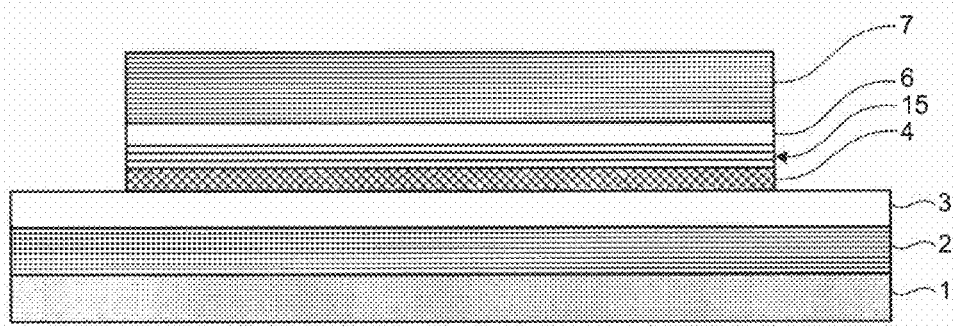
FIG. 6 is a schematic diagram for explaining the method of manufacturing the VCSEL according to the second embodiment.

After the upper DBR mirror 7 is laminated on the selective oxidation layer 15, a plasma CVD method is used to form a silicon nitride film on the growth surface of the upper DBR mirror 7, and a circular pattern having a diameter of about 30 micrometers is transferred to the silicon nitride film by using a photolithography technique using photo resist. The transferred circular resist mask is used to etch the silicon nitride film by reactive ion etching (RIE) using $CF_4$ gas. The silicon nitride film is further etched by reactive ion beam etching (RIBE) using chlorine gas until the etching reaches the n-cladding layer 3, to form, as shown in FIG. 6, the mesa post 10 having a diameter of about 30 micrometers. It is noted that the mesa post 10 is formed in a plurality of numbers on the substrate 1.

Figure 7:
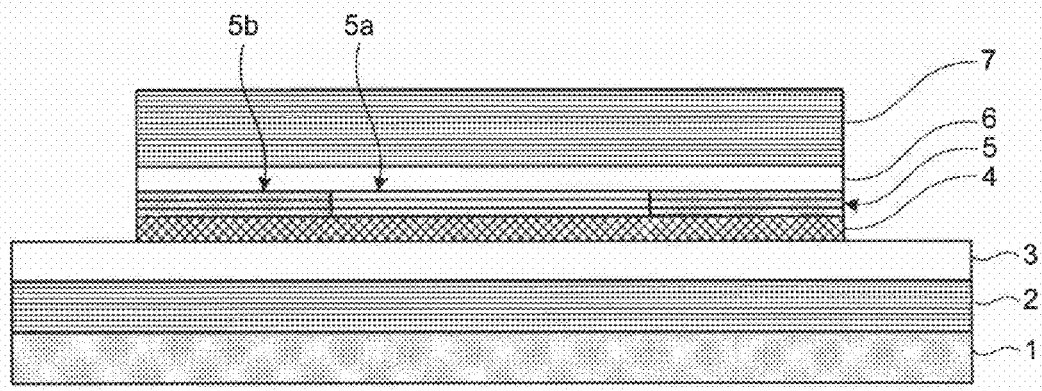
FIG. 7 is a schematic diagram for explaining the method of manufacturing the VCSEL according to the second embodiment.

The mesa post 10 is heated to 400° C. in a water-vapor atmosphere in this state, and by leaving it, the selective oxidation layer 15 is selectively oxidized. With this feature, only the AlAs layers 151 of the selective oxidation layer 15 are selectively oxidized, to form the current confinement region 5a and the selectively-oxidized region 5b as shown in FIG. 7. The current confinement region 5a has a diameter of 3 to 10 micrometers, for example, 6 micrometers.

The oxidation rate of the AlAs layers 151 in the selective oxidation layer 15 has low layer-thickness dependency by the presence of the GaAs layers 152. Therefore, even if there is fluctuation in the thickness of the AlAs layers 151 in the substrate 1, the fluctuation in the diameter of the current confinement regions 5a becomes small among the VCSELs 100 formed on the substrate 1. Consequently, the VCSEL 100 having the current confinement region 5a with a desired diameter can be stably manufactured. It is noted that interdiffusion occurs between the AlAs layer 151 and the GaAs layer 152 during the selective oxidation process and thus the GaAs layer 152 becomes the AlGaAs layer 52.

Next, a silicon nitride film is newly formed over the entire surface of the AlGaAs layer 52 using the plasma CVD. Thereafter, the silicon nitride film is removed to obtain a desired form, and a p-electrode 8 containing Ti/Pt/Au is formed thereon. An n-electrode 9 containing AuGeNi/Au is formed using the same method as above. Thereafter, a p-extraction electrode 11 and an n-extraction electrode 12 are formed to complete the VCSEL 100.

Figure 8:
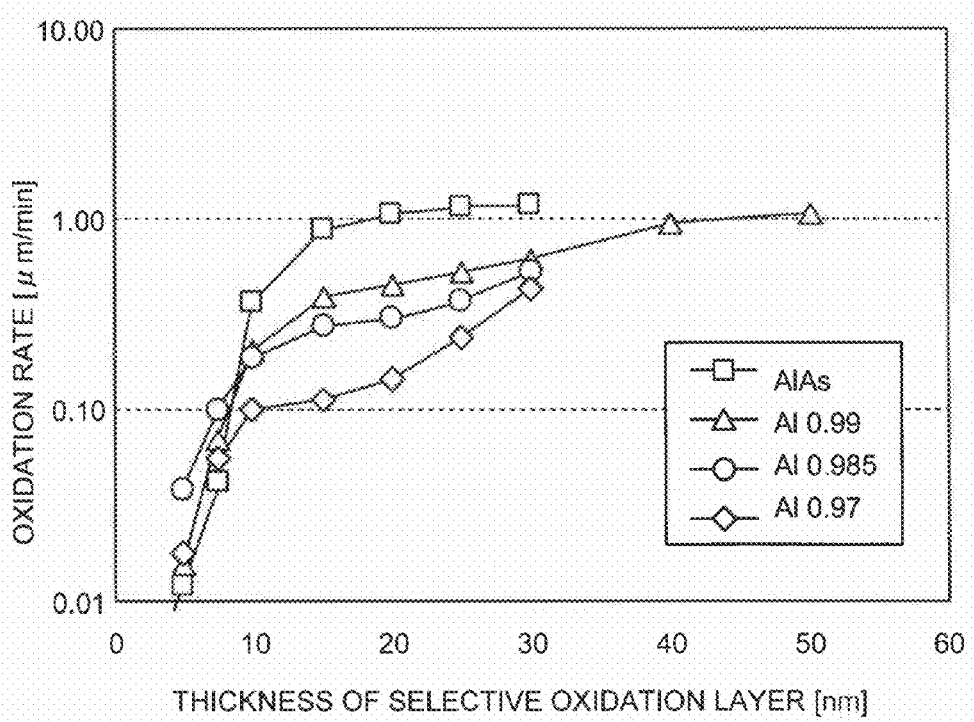
FIG. 8 is a graph of a relationship between a thickness of an entire selective oxidation layer and an oxidation rate.
Figure 9:
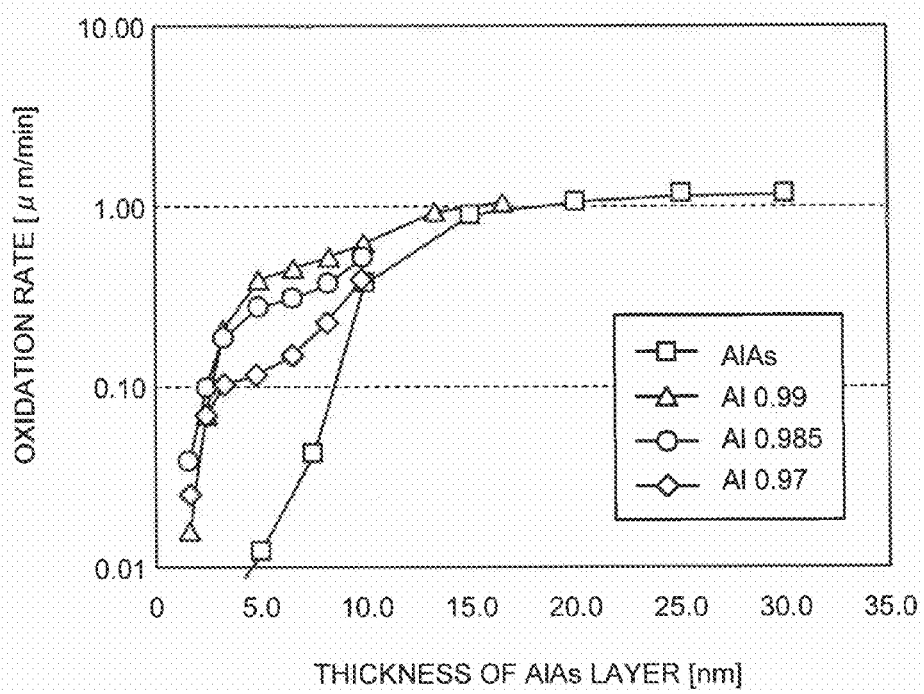
FIG. 9 is a graph of a relationship between a thickness per layer of AlAs layers and an oxidation rate.

A relationship between the layer thickness and the oxidation rate is compared in the cases where the selective oxidation layer contains only the AlAs layers and where the AlAs layer and the GaAs layer are alternately laminated according to the second embodiment. FIG. 8 is a graph of a relationship between a thickness of an entire selective oxidation layer and an oxidation rate. FIG. 9 is a graph of a relationship between a thickness per layer of the AlAs layers and an oxidation rate. In legends of FIGS. 8 and 9, AlAs indicates a case where the selective oxidation layer contains only the AlAs layer. And Al 0.99, Al 0.985, and Al 0.97 indicate a case where thickness ratios between the AlAs layer and the GaAs layer are 99:1, 98.5:1.5, and 97:3 respectively according to the second embodiment. In the following, the case where the selective oxidation layer contains only the AlAs layers is called "bulk AlAs layer".

As shown in FIGS. 8 and 9, when the selective oxidation layer is the bulk AlAs layer and if the layer thickness is about 15 nanometers or less, the oxidation rate rapidly decreases as the layer thickness decreases, and thus oxidation rate is highly layer-thickness dependent. On the other hand, for example, when the selective oxidation layer is Al 0.99, in a region where the layer thickness of the selective oxidation layer is in a range of about 50 nanometers to 8 nanometers, namely where the layer thickness of the AlAs layer is in a range of about 16 nanometers to 2.6 nanometers, the layer-thickness dependency of the oxidation rate shows a curve different from that of the bulk AlAs layer. It is therefore obvious that the oxidation rate does not sharply decrease.

The reason is considered as follows. If the layer thickness of the selective oxidation layer is greater than about 50 nanometers, the AlAs layers are separated by the presence of the GaAs layers. Therefore, the oxidation rate is determined depending on a relationship with a thickness per layer of the AlAs layers. Here, the thickness per layer of the AlAs layers is about 16 nanometers. However, this thickness is in a region where the oxidation rate has low layer-thickness dependency, and thus the oxidation rate becomes equivalent to that of the bulk AlAs layer.

On the other hand, when the layer thickness of the selective oxidation layer is in a range of about 50 nanometers to 8 nanometers, the GaAs layer becomes thin. Therefore, the AlAs layers are not completely separated from each other, and at the same time the GaAs layer functions as a buffer layer. Therefore, as compared with the bulk AlAs layer, even if the layer thickness of the selective oxidation layer decreases, the oxidation rate does not rapidly decrease.

If the layer thickness of the selective oxidation layer is smaller than about 8 nanometers, the thickness of the GaAs layer becomes considerably thin, such as about 0.08 nanometer or less, and thus GaAs layer does not function as a buffer layer. Therefore, the oxidation rate is determined depending on a relationship with the thickness of the entire selective oxidation layer. As a result, the oxidation rate becomes equivalent to that of the bulk AlAs layer.

The region of the layer thickness of the selective oxidation layer, such that the layer-thickness dependency of the oxidation rate shows a curve different from that of the bulk AlAs layer, is different depending on the thickness ratio between the AlAs layer and the GaAs layer. For example, when the thickness ratio between the AlAs layer and the GaAs layer is 97:3 as the Al 0.97 shown in the above case, the region is from about 40 nanometers to 6 nanometers.

More specifically, in the conventional technology, by reducing the layer thickness of the AlAs layer, the oxidation rate rapidly decreases, and thus the thickness is made 100 nanometers or more when the AlAs layer is made as the selective oxidation layer. It is therefore considered that the thickness of the selective oxidation layer has to be 100 nanometers or more even if an AlAs/GaAs digital alloy structure is employed, as explained in G. W. Pickrell et al., "Improvement of wet-oxidized $Al_xGa_{1-x}As$ (x to 1) through the use of AlAs/GaAs digital alloys", Appl. Phys. Lett., vol. 76, No. 18, pp. 2544-2546 (2000).

However, as shown in FIGS. 8 and 9, according to the second embodiment, it is found that by further reducing the AlAs layer when the thickness ratio to the GaAs layer is set to predetermined values, the thickness of the entire selective oxidation layer can be made as thin as 100 nanometers or less, especially 50 nanometers or less while the oxidation rate has low layer-thickness dependency. By thinning the selective oxidation layer in this manner, the stress occurring in the selectively-oxidized region can be reduced when this selective oxidation layer is selectively oxidized to form the current confinement layer. Thus, the reliability of the VCSEL is improved. In other words, according to the second embodiment, a highly reliable VCSEL including a current confinement region having a desired diameter can be stably manufactured.

Figure 10:
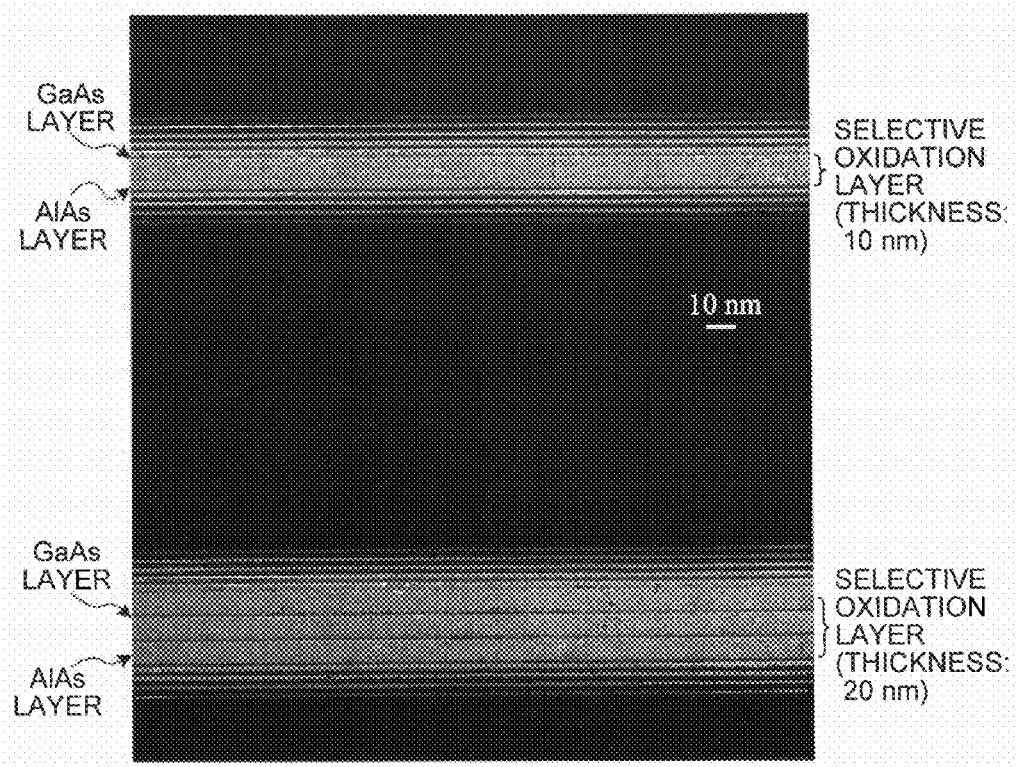
FIG. 10 is a picture of a transmission electron microscopy (TEM) image of a selective oxidation layer formed by alternately laminating an AlAs layer and a GaAs layer according to the second embodiment.
Figure 11:
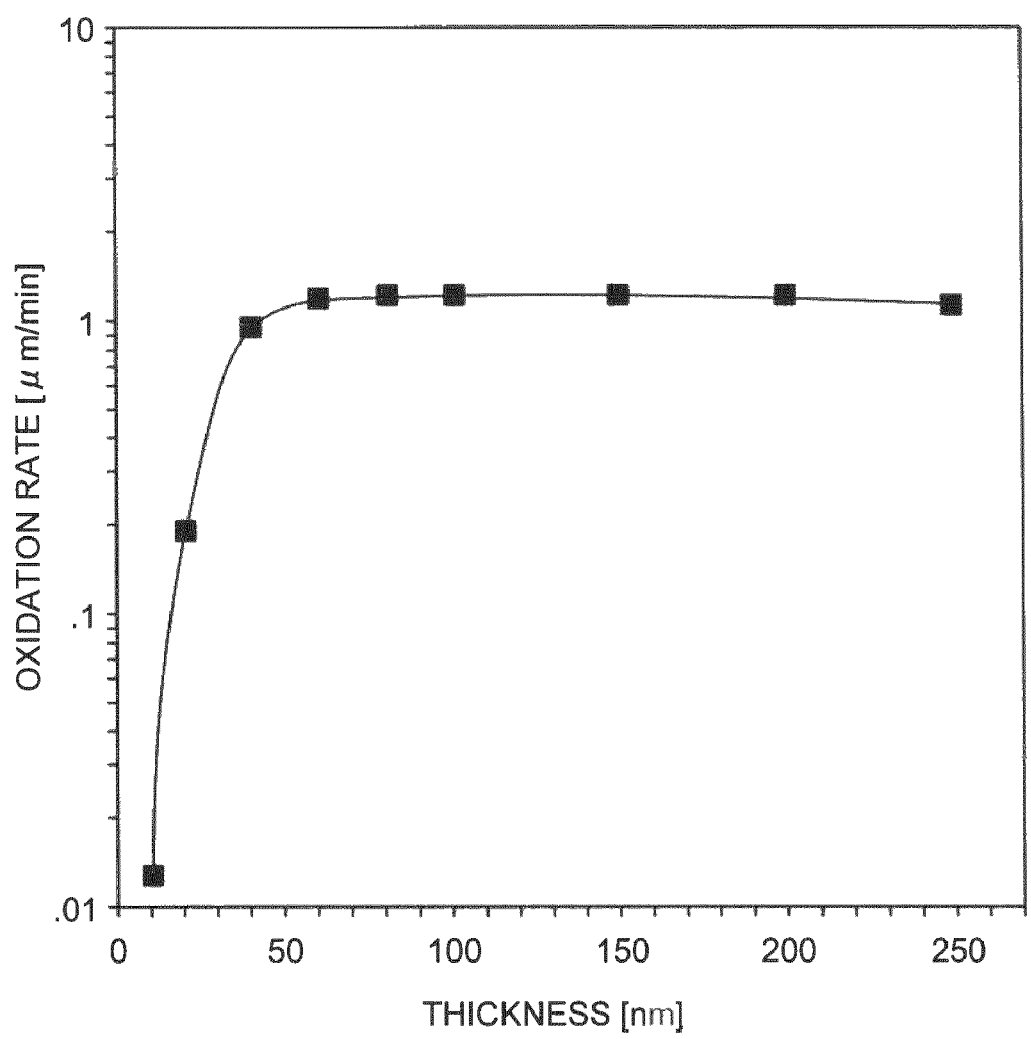
FIG. 11 is a graph of a relationship between a thickness of the AlAs layer and an oxidation rate.

FIG. 10 is a picture of a transmission electron microscopy (TEM) image of the selective oxidation layer formed by alternately laminating the AlAs layer and the GaAs layer according to the second embodiment. The selective oxidation layer shown in the upper side of FIG. 10 has a thickness of 10 nanometers, and the selective oxidation layer shown in the lower side thereof has a thickness of 20 nanometers. A thickness ratio between the AlAs layer and the GaAs layer is 99:1. As shown in FIG. 10, the thickness of the GaAs layer is about 0.03 nanometer in the upper side and about 0.06 nanometer in the lower side. The thicknesses of both of the cases are 1 monolayer of the GaAs layer or less, and the thickness can be easily checked by the TEM.

It is noted that a GaAsSb layer containing a group III element Ga and Sb may be used instead of the GaAs layer in the first and the second embodiments. Although the VCSEL formed of the GaAs semiconductor material is explained above in the first and the second embodiments, the present invention is not limited by this case. For example, if a VCSEL is formed of an InAs semiconductor material containing a group III element In, an InAs layer can be used instead of the GaAs layer. Furthermore, the number of AlAs layers to be laminated are three in the first and the second embodiments. However, if the number is two or more, then it is not particularly limited.

As described above, according to an aspect of the present invention, the method includes the laminating process for alternately laminating the AlAs layer and the XAs layer at a predetermined thickness ratio to form the selective oxidation layer, and the selective oxidation process for selectively oxidizing the selective oxidation layer. Therefore, the oxidation rate has lower layer-thickness dependency, and the fluctuation in diameters of the current confinement regions in the current confinement layers hardly occurs. As a result, it is possible to stably manufacture the VCSEL having the current confinement region with a desired form.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of manufacturing a vertical-cavity surface-emitting laser having a selectively-oxidized current confinement layer, the method comprising:
    forming a selective oxidation layer by alternately growing, on a plurality of semiconductor layers including an active layer, at least two AlAs layers and an As-containing layer containing at least Ga or In such that the As-containing layer is interposed between the at least two AlAs layers and a thickness ratio of each of the at least two AlAs layers to the As-containing layer is in a range between 97:3 and 99:1; and
    selectively oxidizing the selective oxidation layer, wherein said selective oxidation layer has a thickness of less than 100 nm.

2. The method according to claim 1, wherein a thickness of the selective oxidation layer is equal to or thicker than 5 nanometers.

3. The method according to claim 2, wherein a thickness of the selective oxidation layer is equal to or thicker than 5 nanometers and equal to or thinner than 50 nanometers.

4. The method according to claim 1, wherein a thickness of the AlAs layer is equal to or thicker than 2 nanometers and equal to or thinner than 16 nanometers.

5. A vertical-cavity surface-emitting laser, comprising:
    a plurality of semiconductor layers including an active layer; and
    a selective oxidation layer on the plurality of semiconductor layers, the selective oxidation layer including at least two AlAs layers and an As-containing layer containing at least Ga or In interposed between the at least two AlAs layer with a thickness ratio of each of the at least two AlAs layers to the As-containing layer in a range between 97:3 and 99:1, wherein said selective oxidation layer has a thickness of less than 100 nm.

6. The vertical-cavity surface-emitting laser according to claim 5, wherein a thickness of the selective oxidation layer is equal to or thicker than 5 nanometers.

7. The vertical-cavity surface-emitting laser according to claim 6, wherein a thickness of the selective oxidation layer is equal to or thicker than 5 nanometers and equal to or thinner than 50 nanometers.

8. The vertical-cavity surface-emitting laser according to claim 5, wherein a thickness of the AlAs layer is equal to or thicker than 2 nanometers and equal to or thinner than 16 nanometers.

9. The method according to claim 1, wherein the As-containing layer is a GaAs layer.

10. The method according to claim 9, wherein the GaAs layer has a thickness of a monolayer or less.

11. The vertical-cavity surface-emitting laser according to claim 5, wherein the As-containing layer is a GaAs layer.

12. The vertical-cavity surface-emitting laser according to claim 11, wherein the GaAs layer has a thickness of a monolayer or less.

* * * * *